United States Patent [19]

Hill

[11] 4,168,870
[45] Sep. 25, 1979

[54] CABINET FOR ELECTRONIC APPARATUS

[75] Inventor: James A. Hill, Aloha, Oreg.

[73] Assignee: Tektronix, Inc., Beaverton, Oreg.

[21] Appl. No.: 778,405

[22] Filed: Mar. 17, 1977

[51] Int. Cl.² .................... A47B 81/00; H05K 5/00
[52] U.S. Cl. ................................. 312/223; 312/244;
312/DIG. 33; 312/294; 361/390
[58] Field of Search ............... 312/223, 209, 244, 292,
312/294, DIG. 33; 174/50-53; 361/380, 386;
D10/46

[56] References Cited

U.S. PATENT DOCUMENTS

| | | | |
|---|---|---|---|
| D. 215,493 | 9/1969 | Burridge | D10/45 |
| 1,893,527 | 1/1933 | Shriver | 312/DIG. 33 |
| 2,515,338 | 7/1950 | Colegrove | 312/244 |
| 2,983,367 | 5/1961 | Paramater | 312/DIG. 33 |
| 3,036,154 | 5/1962 | Harman | 312/7 TV |
| 3,047,350 | 7/1962 | Eckstein et al. | 312/244 |
| 3,817,588 | 6/1974 | Helmers | 312/209 |

*Primary Examiner*—Casmir A. Nunberg
*Attorney, Agent, or Firm*—George T. Noe

[57] ABSTRACT

A cabinet for an electronic apparatus comprises a housing adapted to provide an upright operating position for conventional bench or floor use, and a substantially horizontal operating position for overhead use. The housing includes a control and display panel which is preferably sloped to facilitate user convenience in either operating position. A portion of the housing adjacent the panel is built up to provide an integral handle and means for shading the display from the glare of overhead lights. A detachable hinged cover is provided to protect the control and display panel. Such cover may include accessory items and may provide storage area therefor.

4 Claims, 5 Drawing Figures

CABINET FOR ELECTRONIC APPARATUS

BACKGROUND OF THE INVENTION

Cabinets for electronic apparatus take many forms and shapes depending on the bulk of the apparatus and intended operation. Test and measurement instruments for servicing electronic equipment are designed to combine the advantages of performance, versatility, and portability. Typically, this type of apparatus, which includes oscilloscopes, digital voltmeters, logic analyzers, counters, etc., is housed in a compact box-like cabinet having a rotatable bail-type handle to permit a choice of several operating positions. The cabinet of this type includes a control and display panel mounted on the front planar surface thereof, and support feet on the bottom and rear planar surfaces thereof for operation or storage in either an upright or horizontal position. However, such instruments, while appearing to be quite versatile, are intended for use no higher than the eye level of an operator, and do not lend themselves to use in applications where the instrument must be located above the operator's head, such as on a high shelf or on the top of a console or rack of equipment. Not only must the operator view the control and display panel from an oblique angle, but the display means is subject to glare from overhead lights.

SUMMARY OF THE INVENTION

The present invention relates to electronic apparatus cabinets or enclosures and more particularly to cabinets for portable electronic test and measurement instruments.

The cabinet of the present invention comprises a housing which substantially encloses the electronic apparatus and which includes two exterior surfaces adapted to provide two support bases for such apparatus, one in an upright operating position and the other in a horizontal operating position. The upright position is particularly useful for conventional bench or floor operation while the horizontal position is particularly useful for overhead use. In this regard, the front panel means, which includes various controls and connectors and display means, is preferably canted or sloped so that in either operating position the panel means is directed toward the operator. A portion of the housing is built up adjacent to the panel means to provide an integral handle to permit carrying the instrument in the upright position and to provide a means for shading the display means from overhead lights in the horizontal position. A detachable hinged cover is provided to protect the panel means when the instrument is not in use and to provide convenient storage for various accessories, such as probes, attenuators, and the like. The cover may be rotatably hinged downward in either of the two previously discussed operating positions, allowing the accessories to be readily available, or such cover may be detached completely.

It is therefore one object of the present invention to provide a novel cabinet for an electronic apparatus which permits two operating positions.

It is another object to provide a novel instrument cabinet to permit operation from a high physical location as well as a low physical position.

It is a further object to provide a novel instrument cabinet having an integral handle and display light-shading means.

It is an additional object to provide a novel instrument cabinet having a detachable hinged cover for both protecting a control and display panel and providing storage therein for accessory items.

BRIEF DESCRIPTION OF THE DRAWINGS

Other object and advantages of the present invention will be apparent from the following detailed description of the preferred embodiment thereof and from the attached drawings of which.

DETAILED DESCRIPTION OF THE DRAWINGS

Figure 1:
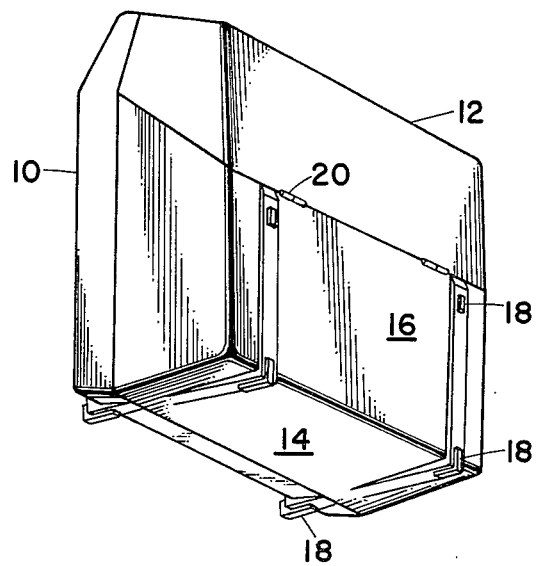
FIG. 1 is a perspective view of a cabinet for an electronic apparatus showing two support bases and a protective cover in place.

FIGS. 1 through 5 show various perspective views of a cabinet for substantially enclosing electronic circuitry and apparatus, thereby forming any instrument as desired. The cabinet includes a housing 10 and a detachable hinged cover 12. Referring to FIG. 1, the housing 10 has a first support base 14 for supporting the instrument in a vertical operating position and a second support base 16 for supporting the instrument in a horizontal operating position. The support bases 14 and 16 may suitably have feet 18 secured thereto in the conventional manner.

The housing 10 may be fabricated using standard construction techniques to provide a suitable enclosure. In the preferred embodiment, the housing 10 is constructed of injection-molded high-impact plastic, such as acrylonitrile-butadiene-styrene (ABS), to provide an atractive, lightweight, compact, and shock-free cabinet. Other construction techniques may include a metal frame with metal or plastic wall inserts; or a shell may be provided of blow-molded or vacuum formed plastic. The cover may be secured to the housing 10 using conventional latching techniques. The hinges 20 may suitably be of the pin and cylinder type to permit the cover 12 to be detached from the housing 10 by sliding the pin out of the cylinder.

Figure 2:
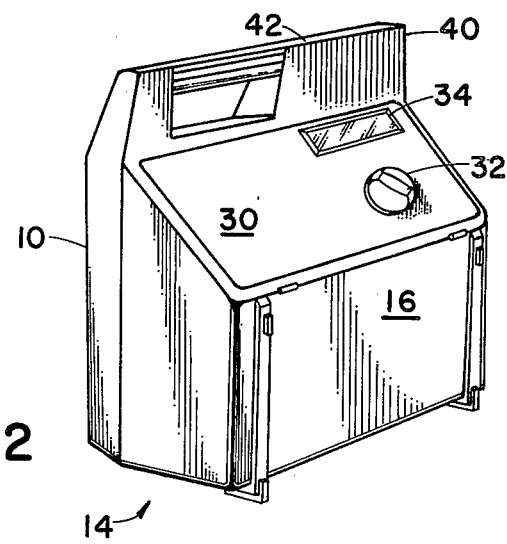
FIG. 2 is a perspective view of a cabinet for an electronic apparatus in an upright operating position.
Figure 3:
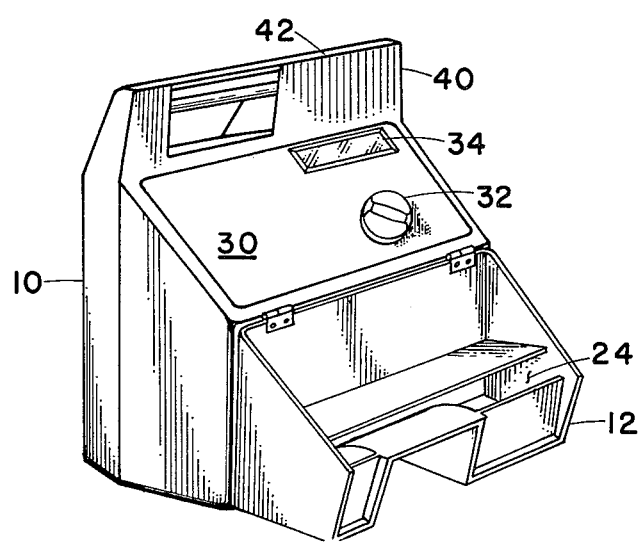
FIG. 3 is a perspective view of a cabinet for an electronic apparatus in an upright operating position with a detachable cover hinged open.
Figure 4:
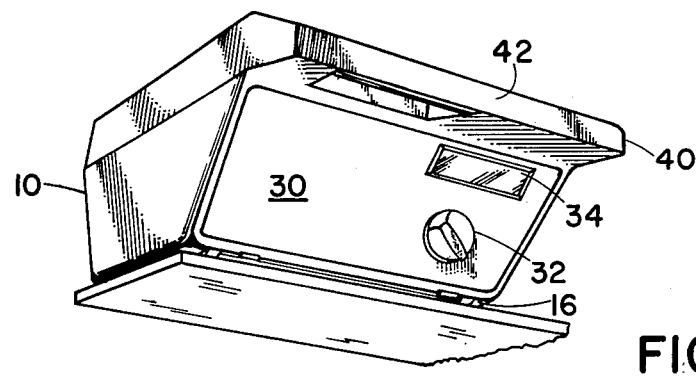
FIG. 4 is a perspective view of a cabinet for an electronic apparatus in a horizontal operating position.
Figure 5:
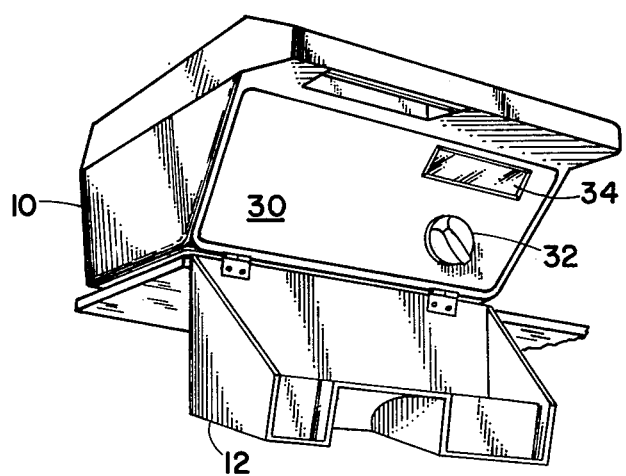
FIG. 5 is a perspective view of a cabinet for an electronic apparatus in a horizontal operating position with a detachable cover hinged open.

FIGS. 2 and 3 show the instrument in an upright operating position wherein the instrument is supported by support base 14, while FIGS. 4 and 5 show the instrument in a horizontal operating position wherein such instrument is supported by support base 16. In FIGS. 2 and 4 the cover 12 is detached, while in FIGS. 3 and 5 the cover 12 is hinged open. One or more storage compartments 24 may be provided within cover 12 for storing accessory items, such as probes, connectors, test leads, attenuators, and the like.

A front panel 30 including various connectors and controls 32 and a display means 34 is provided for operating the instrument, and is preferably canted or sloped with respect to the base surfaces so that in either operating position the front panel is directed toward the operator. In the upright operating position, the instrument is intended for floor or bench use where the instrument is typically below the eye level of an operator. In the horizontal operating position, the instrument is intended for overhead use, such as from a shelf or the top of a rack of electronic equipment. Thus, it can be discerned that for either of these operating positions, the front panel will be directed toward the person using it. The display means 34 may suitably be a meter or a digital readout.

A portion of the housing 10 is built up adjacent to the front panel 30 to provide a shade 40 for shading the display means 34 from the glare of overhead lights, and to provide an integral handle 42 for the instrument. The shade 40 is particularly beneficial in the horizontal operating position or where the display means comprises light-emitting diodes.

Although the foregoing description covers a preferred embodiment of the present invention, it will be apparent to those skilled in the art that many changes and modifications may be made without departing from the subject matter thereof. For example, the housing 10 may have holes or openings therein to provide ventilation for cooling purposes.

I claim:

1. A cabinet for an electronic apparatus, comprising:
    housing means for generally enclosing said apparatus, said housing means having a first support base for supporting said apparatus in an upright position and a second support base for supporting said apparatus in a horizontal position,
    panel means including display means secured to said housing means, said panel means being sloped with respect to both of said first and second support bases; and
    light-shading means disposed adjacent said panel means for shading said display means from excess light.

2. A cabinet in accordance with claim 1 wherein said light-shading means comprises a built-up portion of said housing means, said built-up portion further including an integral handle for said apparatus.

3. A cabinet in accordance with claim 1 further including a detachable hinged cover for protecting said panel means.

4. A cabinet in accordance with claim 3 wherein said cover includes storage compartments therein.

* * * * *